United States Patent [19]
Walker

[11] Patent Number: 5,249,972
[45] Date of Patent: Oct. 5, 1993

[54] ELECTRICAL SOCKET

[75] Inventor: Kevin E. Walker, Harrisburg, Pa.

[73] Assignee: The Whitaker Corporation, Wilmington, Del.

[21] Appl. No.: 995,244

[22] Filed: Dec. 22, 1992

[51] Int. Cl.$^5$ ............................................. H01R 23/72
[52] U.S. Cl. ....................................... 439/72; 439/73; 439/330
[58] Field of Search ................... 439/68–73, 439/330, 331, 525, 526

[56] References Cited

U.S. PATENT DOCUMENTS

| | | | |
|---|---|---|---|
| 3,335,327 | 8/1967 | Damon et al. | 439/72 |
| 4,786,256 | 11/1988 | Angeleri et al. | 439/72 |
| 4,789,345 | 12/1988 | Carter | 439/71 |
| 4,846,704 | 7/1989 | Ikeya | 439/72 |
| 4,969,828 | 11/1990 | Bright et al. | 439/68 |
| 4,993,955 | 2/1991 | Savant | 439/73 |
| 5,161,984 | 11/1992 | Taylor et al. | 439/73 |

FOREIGN PATENT DOCUMENTS 1-20693A  1/1989  Japan .

*Primary Examiner*—Neil Abrams
*Attorney, Agent, or Firm*—Robert J. Kapalka

[57] ABSTRACT

An electrical socket includes a base having a generally central reception area which can receive an electronic device having leads extending to a peripheral region of the reception area. Multiple pressure members are fixed with respect to the base in a manner permitting movement between open and closed positions. Each of the pressure members has a pressure applying portion which is disposed in the peripheral region when the pressure member is in the closed position and is disposed outwardly of the peripheral region when the pressure member is in the open position. A circuit carrying member having conductive traces extends to within the peripheral region. Springs engage the pressure members when in the closed position and bias the pressure applying portions toward the traces, whereby the electrical leads can extend under the pressure applying portions and be urged by biasing forces against the traces. The pressure members are guided for both tranlational movement and pivoting movement with respect to the base and are movable against the bias of the springs. The pivoting movement relieves the biasing forces from the electrical leads and the translational movement withdraws the pressure applying portions to an area beyond the peripheral region.

9 Claims, 8 Drawing Sheets

ELECTRICAL SOCKET

BACKGROUND OF THE INVENTION

1. Field of the Invention

The invention relates to an electrical socket for burn-in and other tests on electronic devices, and more particularly, to an electrical socket having multiple pressure members that are biased to urge electrical leads of an electronic device against conductive traces of a circuit carrying member.

2. Prior Art

Electronic devices are commonly subject to burn-in and other testing at the time of manufacture to assure that the devices are free of defects when delivered to a customer. Burn-in testing includes subjecting the devices to elevated temperatures in an oven, thereby stressing the devices in order to quickly simulate numerous operating cycles. The burn-in testing causes break down of inferior elements so as to reveal those devices that would be likely to fail before achieving a minimum acceptable service life.

Flat pack electronic devices have numerous leads that are relatively narrow in order to achieve small centerline spacing (0.4 mm and smaller). The leads are easily marred or nicked during testing, and such damage is unacceptable. To avoid this problem, testing may occur at distal ends of the leads which are then removed prior to final lead forming.

An electrical socket for mounting a flat pack electronic device during burn-in and other testing is disclosed in U.S. Pat. No. 5,161,984 (Taylor et al.). The socket includes a base with a central area for receiving the device and a recessed area over which the leads of the device extend. A flexible etched circuit member is placed on the base with contact pads on one end of conductive traces being supported in the recessed area. The other ends of the traces are terminated to a printed circuit board (PCB). Pressure members on the base apply a normal force to the leads and contact pads to establish an electrical engagement therebetween.

Typically during the burn-in testing, a plurality of sockets having electronic devices to be tested are mounted on a PCB, and a plurality of PCB's having the sockets thereon are inserted in layered relationship in an oven. Reducing the height of the socket and its area on the PCB would permit a greater density of sockets to be inserted in a given size oven, thereby increasing the rate at which electronic devices could be tested, and correspondingly increasing production.

The pressure members disclosed by Taylor et al. are pivotally attached to the base and are inclined upwardly and outwardly away from the central area. The inclination of the pressure members adds to the overall height of the socket, and the pressure members extend further outwardly during pivoting movement. It would be desirable to provide an electrical socket for burn-in testing of electronic devices which has a reduced height and covers a smaller area on a PCB compared with the known electrical sockets. It would also be desirable to provide a top-actuated, top-loaded socket for use with robotic equipment, and to provide a socket that is repairable without desoldering of any connections.

SUMMARY OF THE INVENTION

It is an object of the invention to provide an electrical socket for burn-in and other tests on electronic devices.

It is another object of the invention to provide an electrical socket that is more compact than prior art electrical sockets.

It is a further object of the invention to provide an electrical socket having multiple pressure members that are biased to urge electrical leads of an electronic device against conductive traces of a circuit carrying member.

It is yet another object of the invention to provide an electrical socket having multiple pressure members that are guided for both translational movement and pivoting movement.

It is still another object of the invention to provide an electrical socket suitable for top-loading and top-actuation by robotic equipment.

It is still another object of the invention to provide an electrical socket that can be disassembled for repair without desoldering of electrical connections to a printed circuit board.

These and other objects are accomplished by an electrical socket including a base having a generally central reception area in which can receive an electronic device having electrical leads extending to a peripheral region of the reception area. Multiple pressure members are fixed with respect to the base in a manner permitting movement between open and closed positions. Each of the pressure members has a pressure applying portion which is disposed in the peripheral region when the pressure member is in the closed position, and is disposed outwardly of the peripheral region when the pressure member is in the open position. A circuit carrying member having conductive traces extends to within the peripheral region. Springs engage the pressure members in the closed position and bias the pressure applying portions toward the traces, whereby the electrical leads can extend under the pressure applying portions and be urged by biasing forces against the traces. The pressure members are guided for both translational movement and pivoting movement with respect to the base and are movable against the bias of the springs such that the pivoting movement relieves the biasing forces from the electrical leads and the translational movement withdraws the pressure applying portions to an area beyond the peripheral region. In a preferred embodiment, a pair of cam blocks is mounted with respect to the base on opposite sides of each of the pressure members. Each of the cam blocks defines a slot which slidably receives a projection extending from its associated pressure member. The slots are configured to guide the pressure members through the translational and pivoting movements when actuation forces are applied to the pressure members.

BRIEF DESCRIPTION OF THE DRAWINGS

There are shown in the drawings the embodiments of the invention that are presently preferred. It should be understood, however, that the invention is not limited to the precise arrangements and instrumentalities shown in the drawings, wherein.

DETAILED DESCRIPTION OF THE PREFERRED EMBODIMENTS

Figure 1:
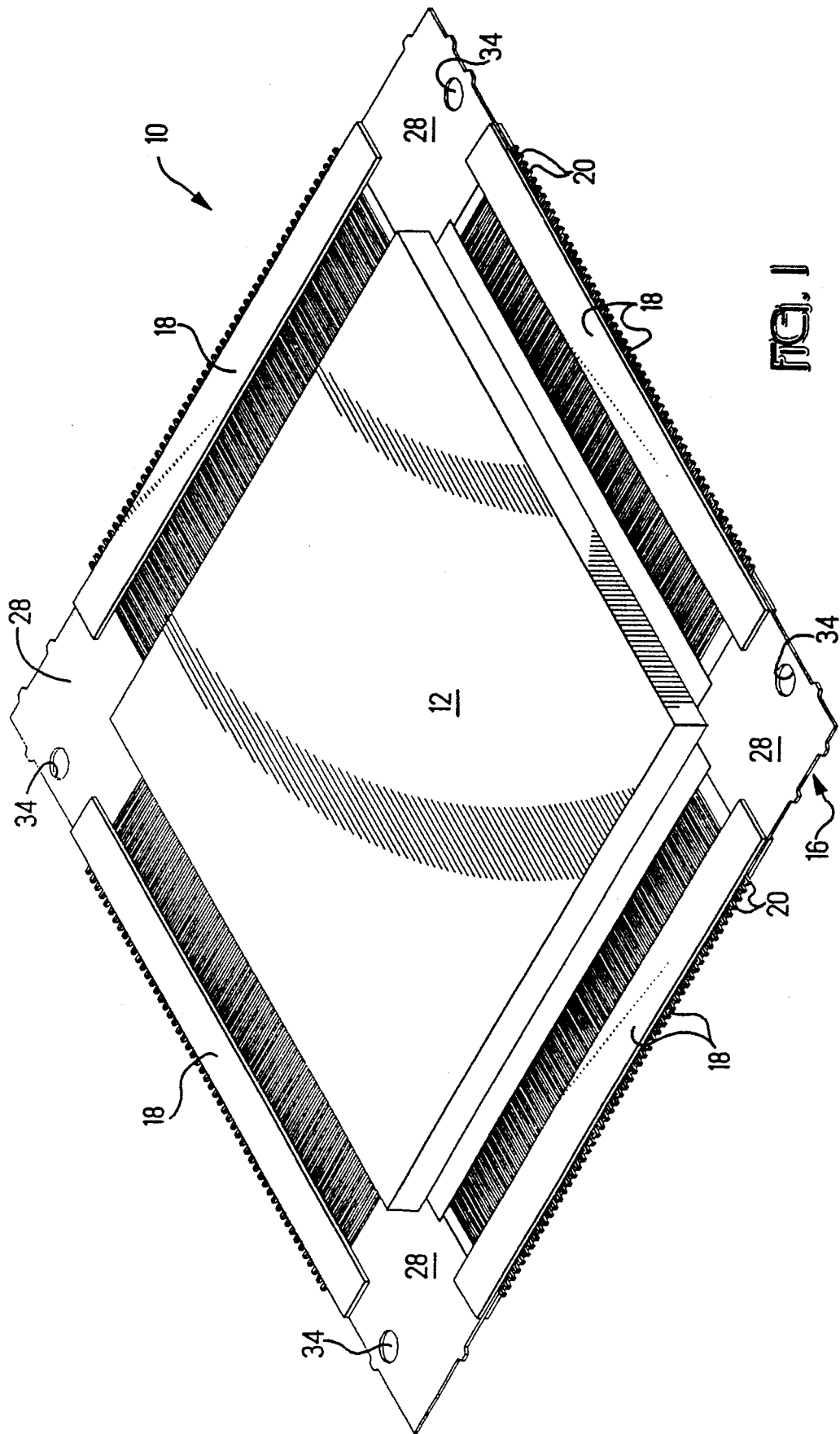
FIG. 1 is an isometric view of a flat pack electronic device in form for testing.
Figure 2:
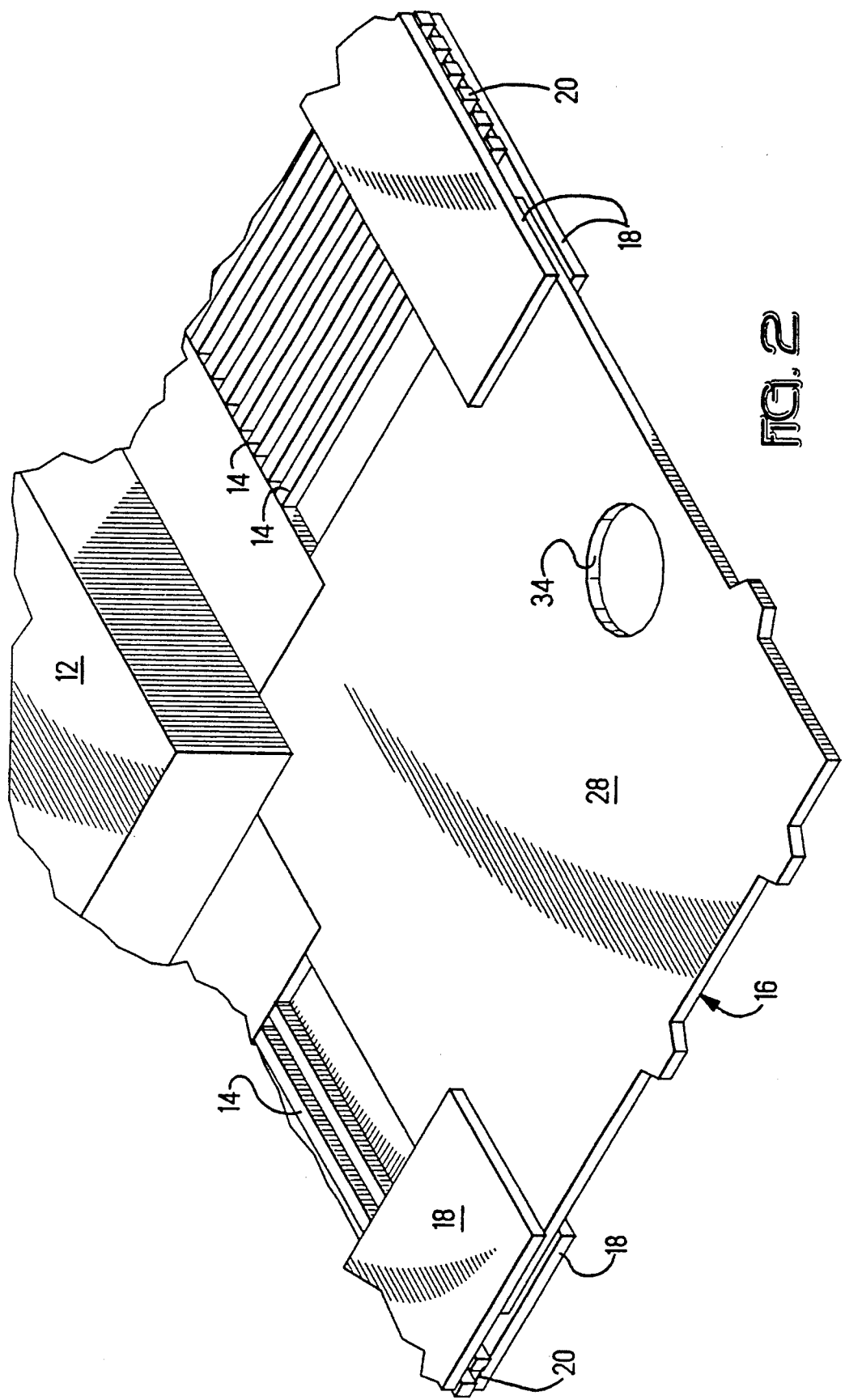
FIG. 2 is a detailed isometric view of one corner of the flat pack electronic device shown in FIG. 1.

An electrical socket according to the invention is particularly adapted to accommodate a flat pack electronic device, such as a plastic quad flat pack (PQFP), during electrical testing of the device. As shown in FIGS. 1 and 2, a flat pack electronic device shown generally as 10 has a body 12 from which leads 14 extend. The leads 14, which are shown in the drawings to be flat, will later be formed into a final gull-wing shape.

The body 12 is carried on lead frame 16 from which the leads 14 were originally formed. Layers 18 are preferably mylar tape which is laid along end areas 20 on both sides of the leads 14. The layers 18 stiffen the leads so as to prevent bending and misalignment and maintain correct centerline spacing of the leads during handling and insertion into the socket to be described hereinafter. Three corner areas 28 are provided with alignment holes 34 which receive alignment pins of the socket.

Figure 3:
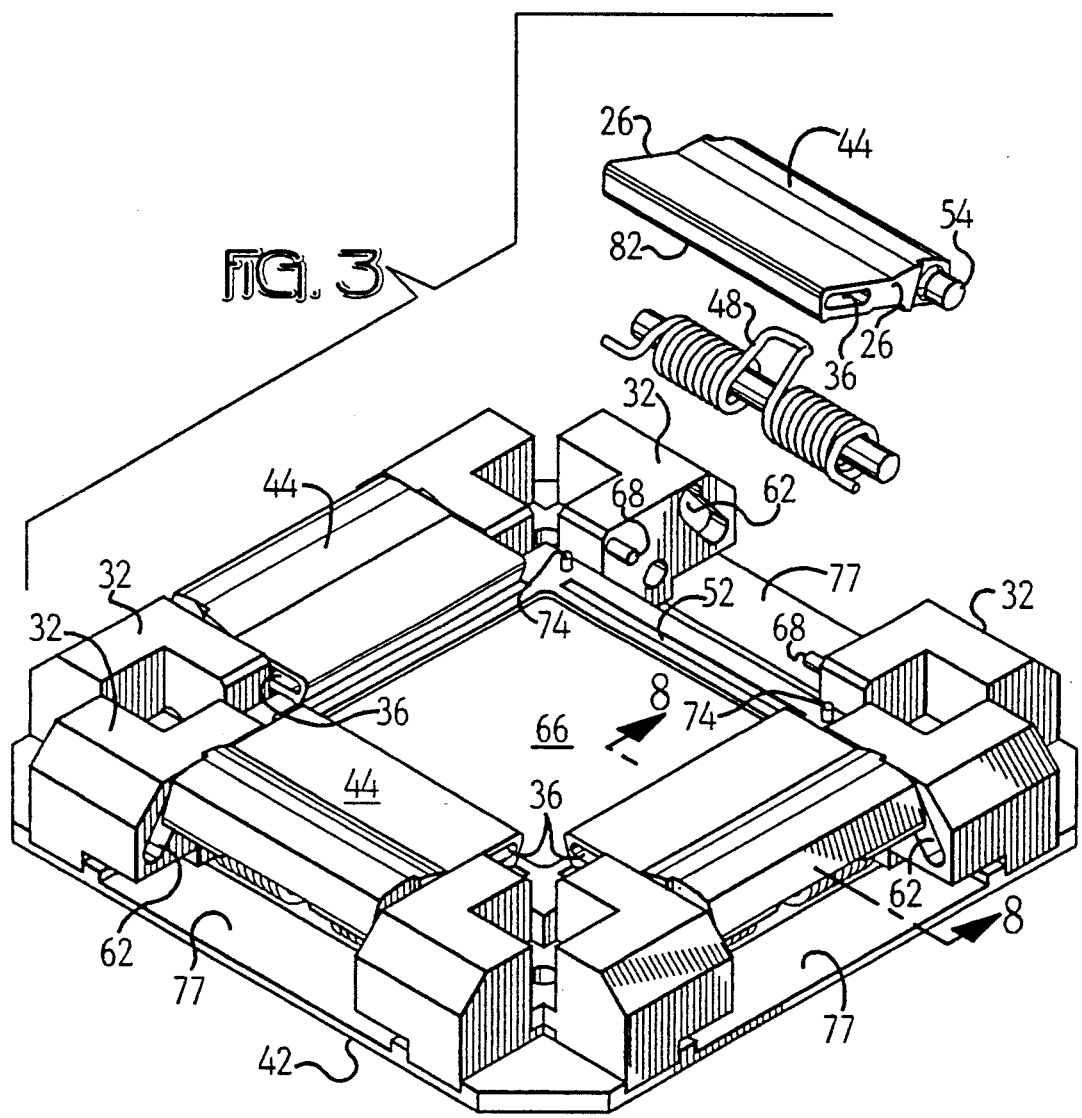
FIG. 3 is an isometric view of a socket in accordance with the present invention, shown partially exploded.
Figure 4:
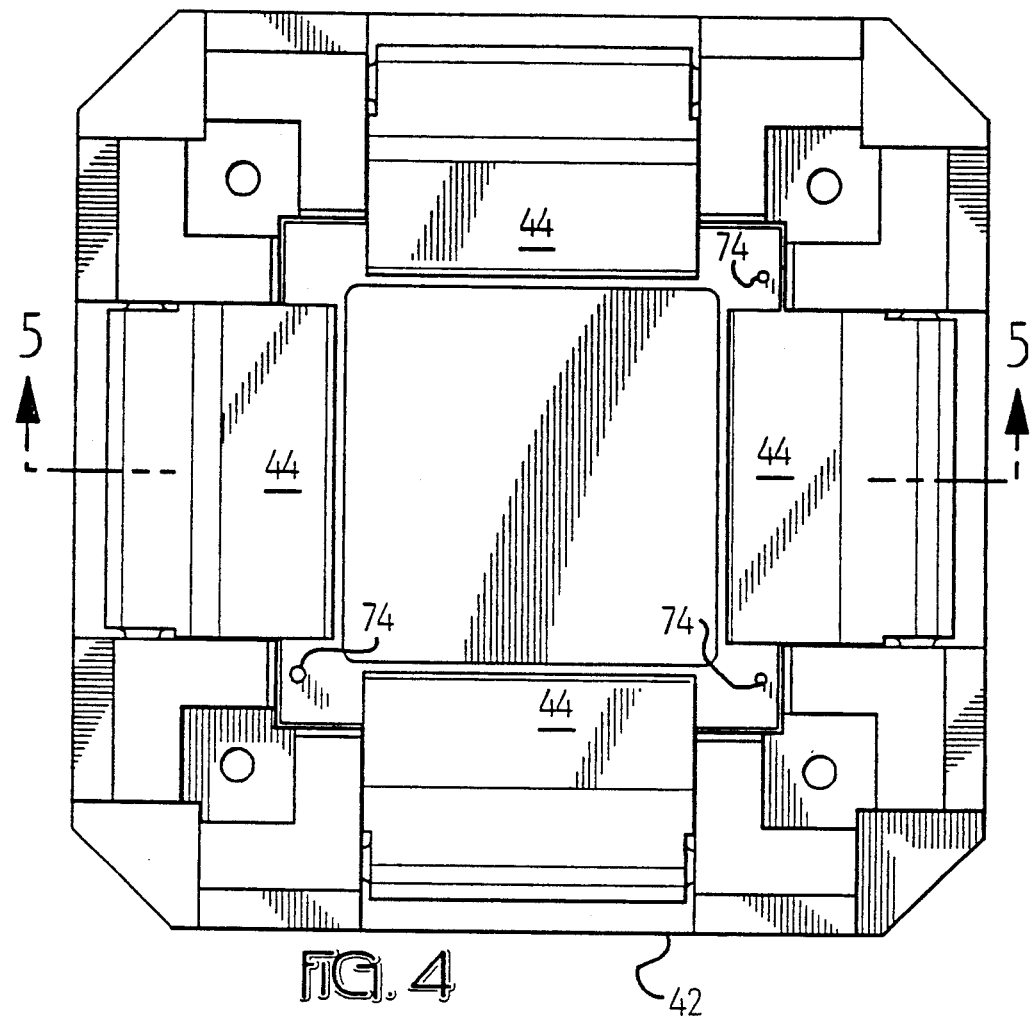
FIG. 4 is a top plan view of a socket according to the invention.
Figure 5:
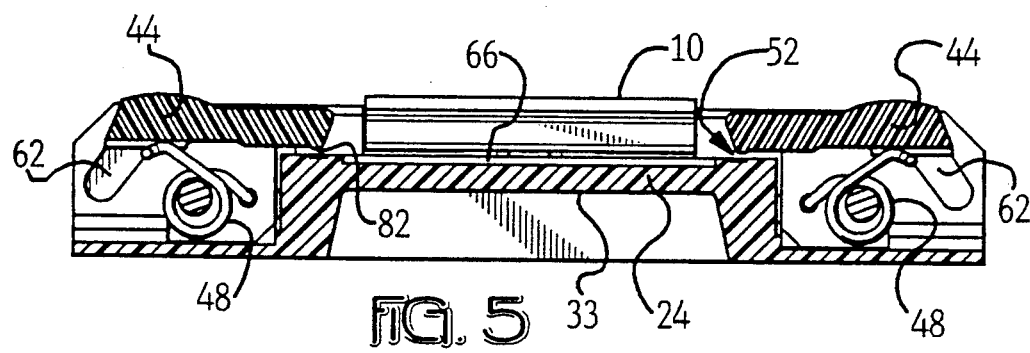
FIG. 5 is a cross-sectional view taken along line 5—5 of FIG. 4.

Socket 40 of the present invention is shown in FIGS. 3-5. The socket 40 includes base 42 having a generally central raised platform 24 defining a generally central reception area 66 which can receive the body 12 of the electronic device 10. The reception area 66 is bordered by a peripheral region 52 acting as a support for electrically conductive traces to be more fully described hereinafter. In a preferred embodiment shown in detail in FIGS. 11 and 11a, the peripheral region 52 is defined by elastomeric pads 122 disposed in grooves 56 defined by upraised surface 58 of the raised platform 24. The base 42 is made from a high dielectric, preferably plastic, material. When the body 12 of the electronic device 10 is disposed in the reception area 66, the leads 14 extend to the peripheral region 52.

Figure 6:
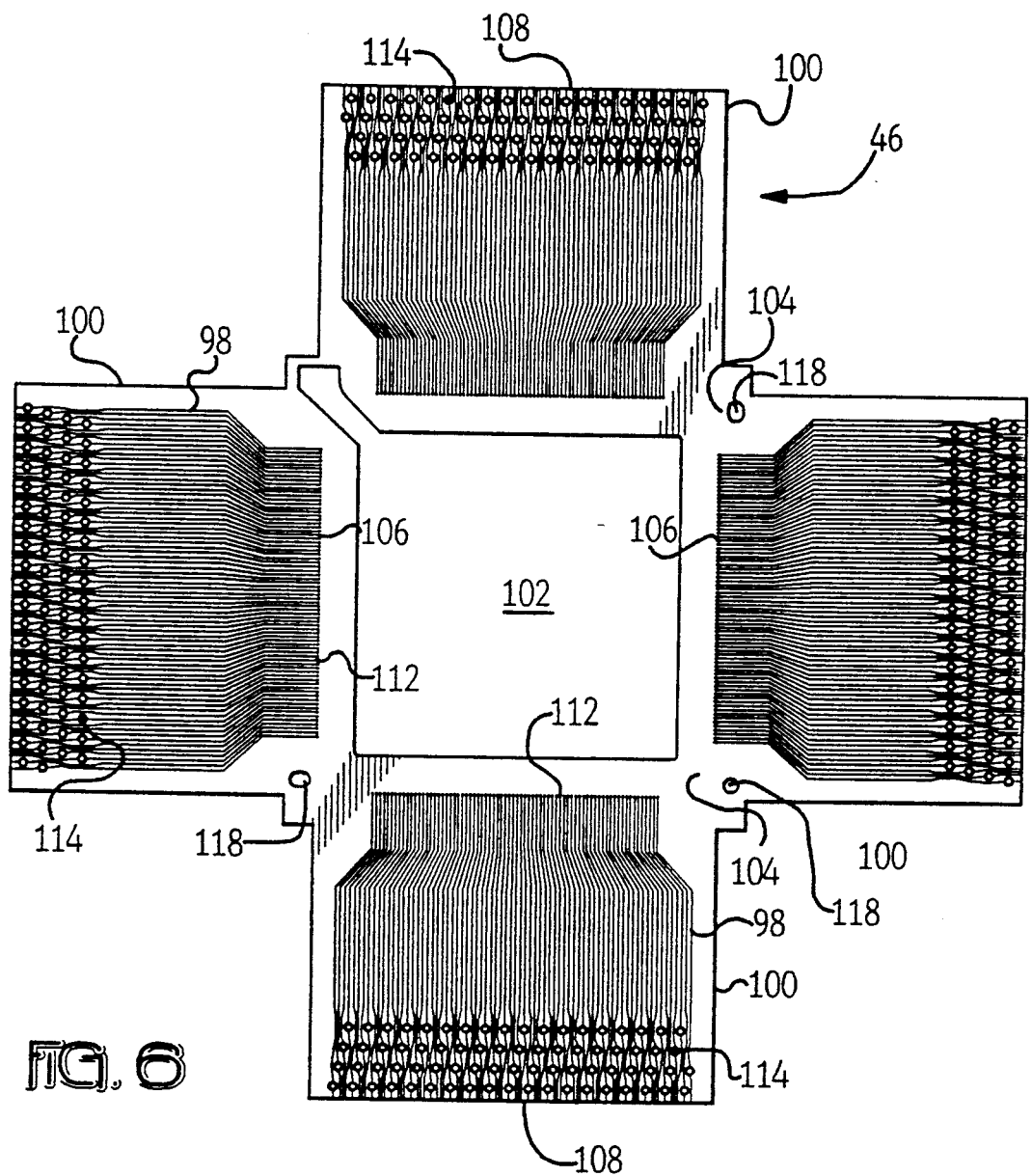
FIG. 6 is a top plan view of a flexible circuit carrying member used in the socket.
Figure 7:
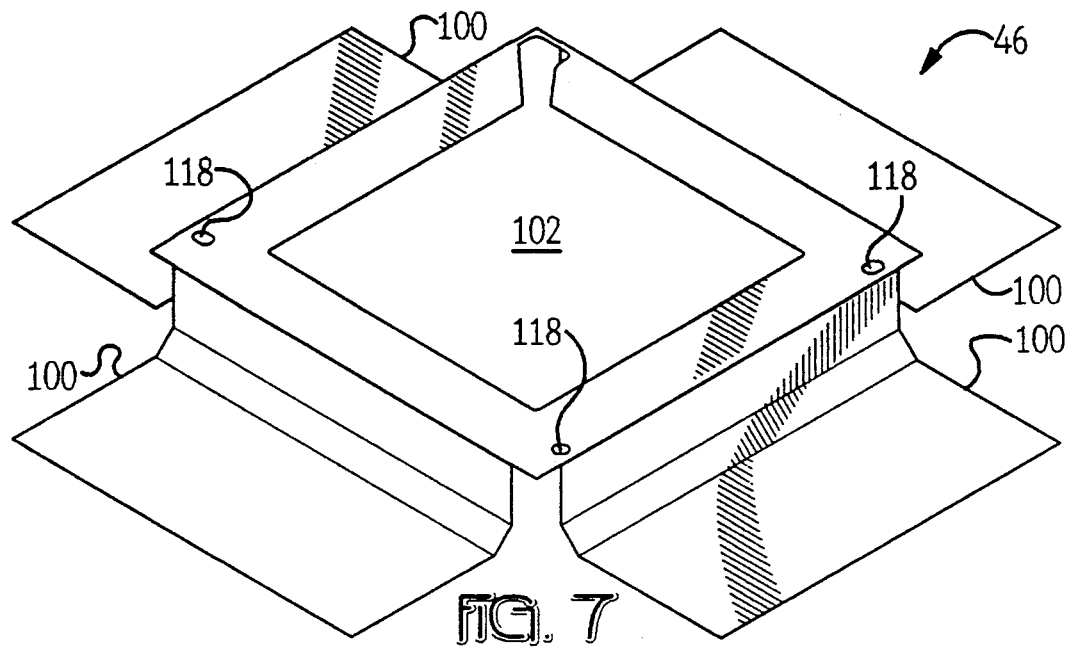
FIG. 7 is an isometric view of the flexible circuit carrying member of FIG. 6, showing a bent configuration suitable for placement on the socket according to the invention.

A flexible etched circuit (FEC) member 46 is shown in FIG. 6. The FEC member 46 is a thin film which is commercially available from various manufacturers and generally includes conductive traces on a dielectric substrate such as a polyester film sold under the trade name KAPTON by the DuPont Company. The FEC member 46 includes conductive traces 98 on flaps 100 which are on each side of a large central opening 102. Narrow straps 104 extend between and connect adjacent flaps 100.

The conductive traces 98 include inner ends 106 adjacent to opening 102 and outer ends 108 adjacent to free ends 110. Preferably a raised contact bump or pad 112 is provided on each of the traces 98 at the inner ends 106. The raised pads 112 are shown more clearly in FIG. 11a. Holes 114 through the FEC member 46 are provided along each of the traces 98. The holes 114 are staggered in order to accommodate pins therethrough and facilitate termination of the traces 98 as will be discussed below. Alignment holes 118 are provided through three of the straps 104 of the FEC member 46. The alignment holes 118 receive alignment pegs 74 extending from the base member 42 for registration and alignment of the FEC member 46 on the base 42. The FEC member 46 resides on the base 42 such that the central area 66 of the base 42 is accessible through the central opening 102 of the FEC member 46.

Referring now to FIGS. 8-11a, the inner ends 106 of the traces 98 extend to within the peripheral region 52 of the central area 66 such that the contact pads 112 are supported by the elastomer pads 122 in the grooves 56. The flaps 100 of the FEC member 46 extend downwardly from the raised platform 24 to a bottom portion 77 of the base 42. The outer ends 108 of the traces are terminated to circuit board 126 by pins 128 which extend through the holes 114 and corresponding holes in the bottom portion 77 of the base 42.

An underside of the raised platform 24 defines a cavity 33 which is dimensioned to house electrical components such as resistors and capacitors of the circuit board 126 when the socket 40 is mounted thereon, thereby reducing in size that portion of the circuit board required for mounting the socket 40 and its associated electrical circuitry. It is also desirable that the raised platform 24 be apertured or open in the reception area 66 to permit passage of air from the cavity 33 so as to provide a cooling airflow for the electrical components housed therein.

Figure 8:
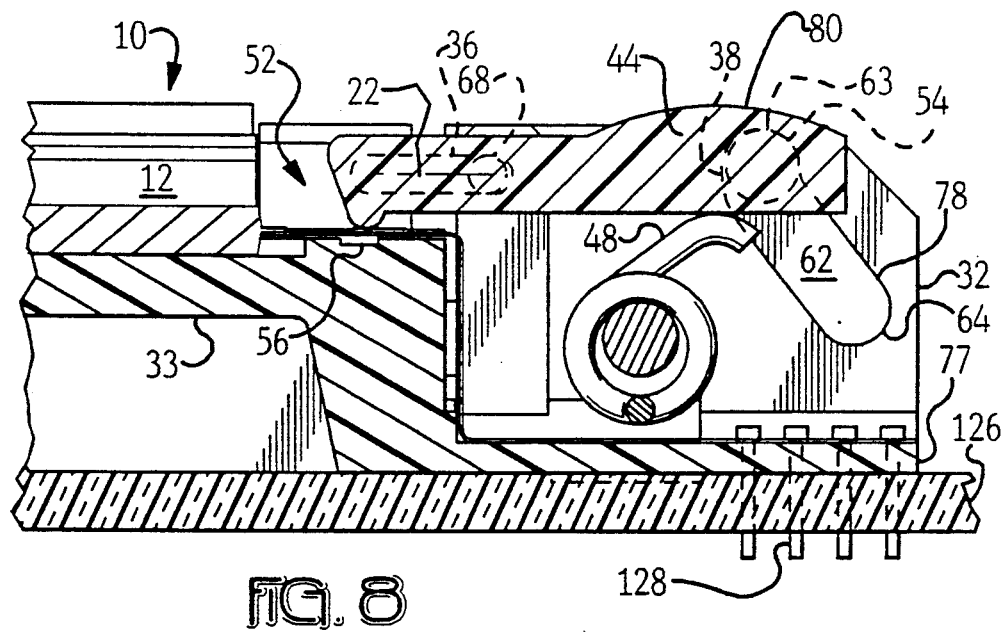
FIG. 8 is a partial sectional view taken along line 8—8 of FIG. 3, showing a pressure member in a closed position.
Figure 10:
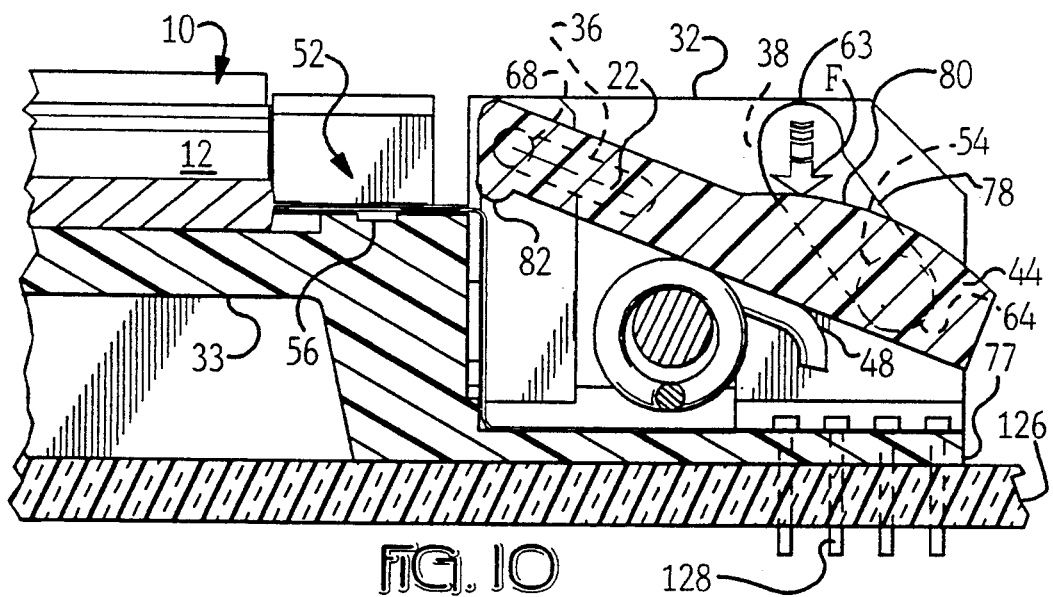
FIG. 10 is a partial sectional view taken along line 8—8 of FIG. 3, showing a pressure member having been moved pivotally and translationally to a fully open position.

Multiple pressure members 44 are fixed with respect to the base in a manner permitting movement between an open position, shown in FIG. 10, and a closed position, shown in FIG. 8. Each of the pressure members 44 has a pressure applying portion 82 which is disposed in the peripheral region 52 when its respective one of the pressure members 44 is in the closed position, and is disposed outwardly of the peripheral region when its respective one of the pressure members 44 is in the open position. The pressure members 44 are guided for both translational movement and pivoting movement with respect to the base between the open and closed positions.

In a preferred embodiment for a guide means according to the invention, corresponding pairs of cam blocks 32 are disposed adjacent pairs of opposite sides 26 of the pressure members 44. Each of the cam blocks 32 defines a slot 62 which slidably receives a guided projection 54 extending from one of the sides 26 of the pressure members 44. Corresponding pairs of the slots 62 adjacent opposite ones of the sides 26 are mirror images of each other. As shown in the drawings, the slots 62 extend from a first end 63 through a vertical portion 38 and an oblique portion 78 to a second end 64.

Figure 9:
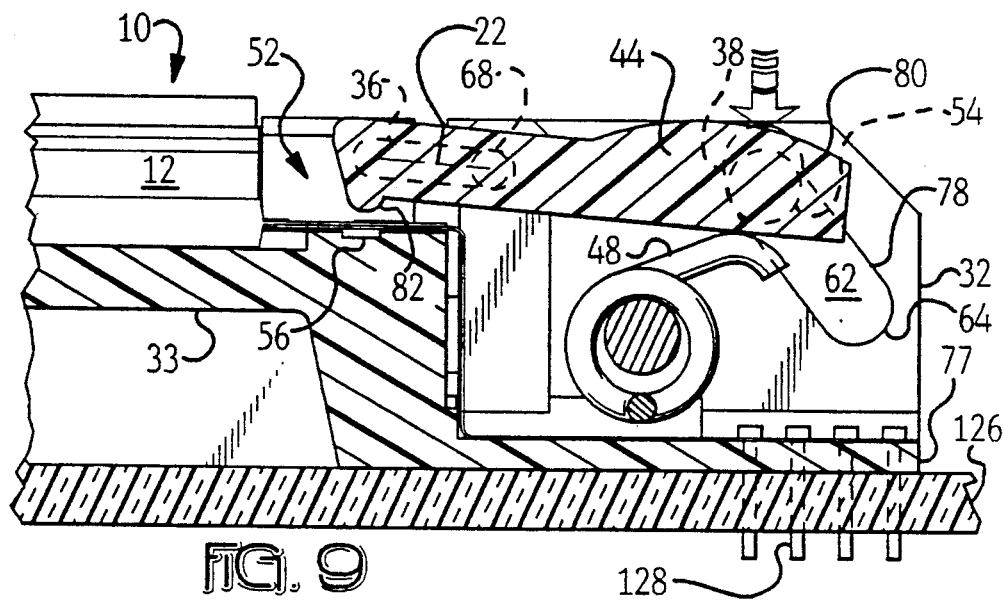
FIG. 9 is a partial sectional view taken along line 8—8 of FIG. 3, showing a pressure member having been pivoted to a partially open position.

The guide means further includes fixed projections 68 extending from the cam blocks 32 and disposed in slots 36 in the pressure members 44. As shown in the drawings, the slots 36 extend linearly and are oriented perpendicular to the vertical portions 38 of the slots 62 when the pressure members 44 are in the closed position. The slots 62 and 36, having the guided and fixed projections 54 and 68 disposed therein, respectively, are configured to guide the pressure members 44 through translational and pivoting movement when vertical actuation forces are applied to the pressure members as shown in FIGS. 9-10.

Although the configuration and orientation of the slots 62 and 36 have been described with some particularity, it will become apparent to those skilled in the art that the slots 62 and 36 could be configured in different ways, such as the slot 62 defining any one of a variety of smoothly curving arcs, without deviating from the scope of the invention, and the invention is not intended to be limited to the currently preferred embodiments described herein.

Figure 11:
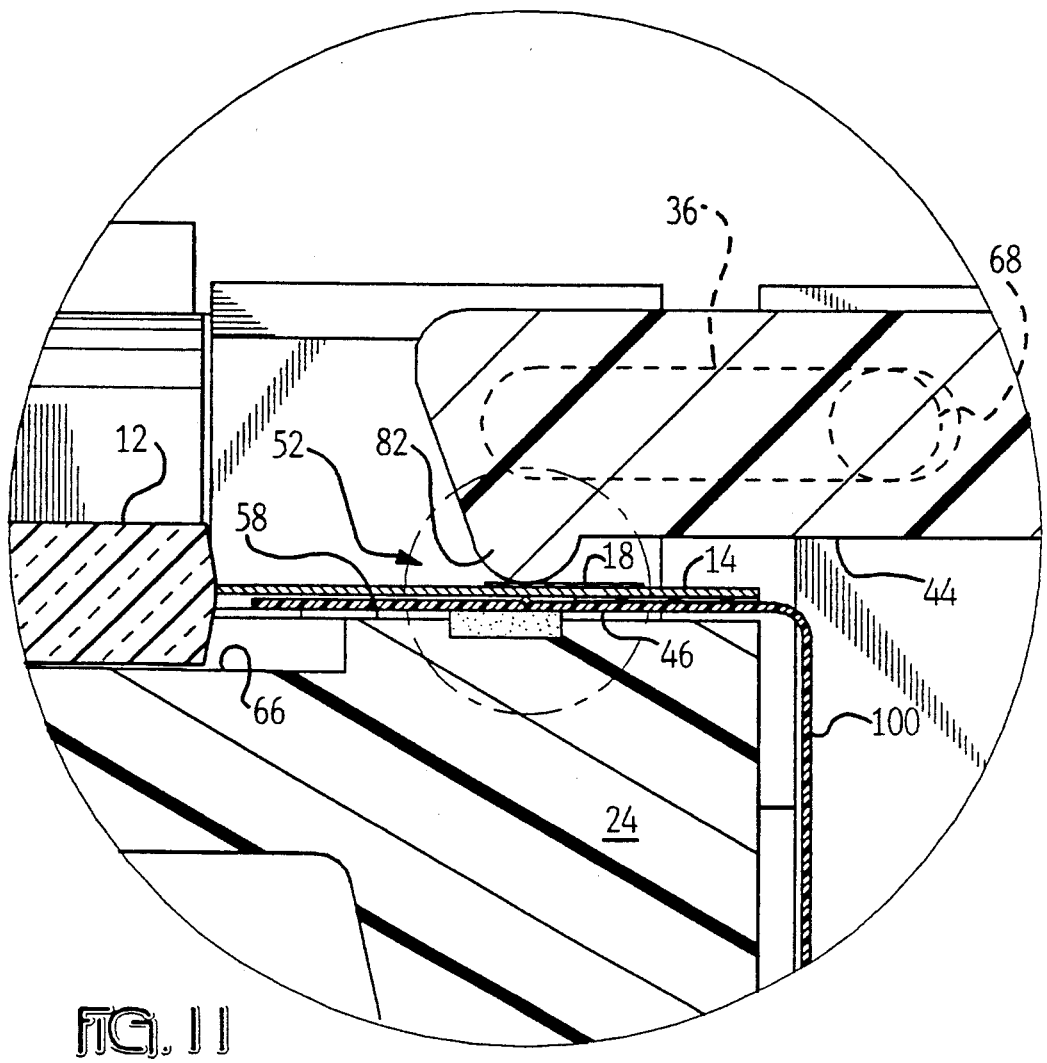
FIG. 11 is an enlarged view of a portion of the socket shown in FIG. 8.
Figure 11A:
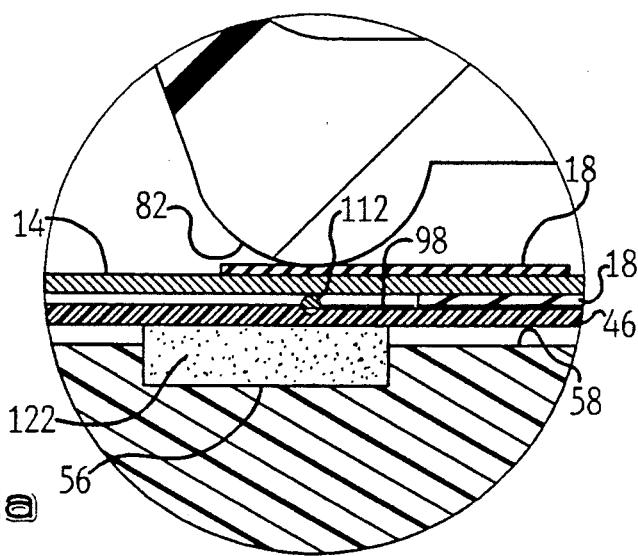
FIG. 11a is an enlarged view of a portion of FIG. 11.

When the pressure members 44 are in the open position as shown in FIG. 10, the test device 10 can be placed on the socket 40. As shown in FIGS. 11 and 11a, the leads 14 extend to the peripheral region 52 under the pressure applying portions 82.

Referring again to FIG. 8, springs 48 mounted with respect to the base engage the pressure members 44 in the closed position and bias the pressure applying portions 82 toward the traces 98, thereby providing a normal force to engage the leads 14 against the contact pads 112. As shown in FIGS. 9 and 10, when an actuation force F is applied to the pressure member 44 in opposition to the spring biasing force, the projection 54 is initially guided vertically downwardly in the vertical portion 38 of the slot 62, thereby pivoting the pressure member 44 on the projection 68. The pivoting movement relieves the biasing force from the leads 14. Further application of the actuation force F urges the projection 54 downwardly along the oblique portion 78. The pressure member 44 undergoes a further pivoting movement on the projection 68 in combination with a translational movement defined by relative movement of the projection 68 with respect to a longitudinal axis 22 of the slot 36. The translational movement withdraws the pressure applying portion 82 to an area beyond the peripheral region 52, as shown in FIG. 10.

The socket of the present invention is especially well-suited for robotic applications wherein actuating members having minimal dexterity are limited to simple linear movements. The application force F can be applied to each of the pressure members 44 by robotic arms (not shown) pushing down on curved surfaces 80. When the pressure members 44 are in the open position, the electronic device 10 can be inserted or removed by another vertically movable robotic arm.

The FEC member 46 may be readily replaced with a like member 46 or one having different trace densities and configurations.

The socket 40 of the present invention was developed as a test socket for the flat pack electronic device 10 having the leads 14 extending straight out from the body 12. However, it should be clear that the socket 40 can also be used as a production socket. Further, the socket 40 can be used with other types of electronic devices with minimal modification except for size.

The socket 40 according to the invention has the advantages of reduced overall height and reduced area on a printed circuit board compared with the prior art burn-in test sockets, thereby enabling greater density of sockets on the circuit board and closer packing of circuit boards in an oven during the burn-in testing. These advantages lead to an increase in the number of sockets tested per unit of time, thus achieving increased production of sockets and lower production costs. The socket has the further advantage that it can be actuated by vertically movable robotic arms, and a test device can be top-loaded in the socket.

The socket also has a construction that lends itself to repair. While the FEC member 46 remains connected to the circuit board 126 by the pins 128 extending through the base 42, all movable members of the socket can be unbolted from the base 42 for repair or replacement. This feature eliminates having to desolder the socket from the circuit board in order to effect repairs. Desoldering can damage inside traces on a multi-layer circuit board, and such damage, although not externally visible, will render the circuit board inoperable for further burn-in testing. The socket of the present invention thus minimizes any likelihood of accidentally ruining an expensive burn-in test circuit board.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

I claim:

1. An electrical socket, comprising:
   a base having a generally central reception area which can receive an electronic device having electrical leads extending to a peripheral region of said reception area;
   multiple pressure members being fixed with respect to the base in a manner permitting movement between open and closed positions, each of the pressure members having a pressure applying portion which is disposed in the peripheral region when the pressure member is in the closed position and is disposed outwardly of the peripheral region when the pressure member is in the open position;
   a circuit carrying member having conductive traces extending to within said peripheral region;
   springs engaging said pressure members when in said closed position in a manner biasing said pressure applying portions toward said traces, whereby the electrical leads can extend under said pressure applying portions and be urged by biasing forces against said traces;
   wherein said pressure members are guided for both translational movement and pivoting movement with respect to said base and are movable against the bias of said springs such that said pivoting movement relieves said biasing forces from said electrical leads and said translational movement withdraws said pressure applying portions to an area beyond said peripheral region.

2. An electrical socket according to claim 1, wherein said base has a raised platform which defines said reception area, and an upraised surface of said raised platform defines said peripheral region.

3. An electrical socket according to claim 2, wherein said circuit carrying member extends from said peripheral region to a mounting surface of said base for direct connection to a circuit board.

4. An electrical socket according to claim 3, wherein an underside of said base defines a cavity dimensioned to house electrical components of the circuit board when the base is disposed on the circuit board.

5. An electrical socket according to claim 1, wherein said pressure members extend in different respective directions away from said reception area, and are adapted to receive actuation forces to move the pressure members against the biasing forces to the open position.

6. An electrical socket according to claim 5, further comprising cam blocks mounted with respect to the base, the cam blocks defining slots which slidably receive guided projections extending from the pressure members, the slots being configured to guide the pressure members through the translational and pivoting movements when the actuation forces are applied to the pressure members.

7. An electrical socket according to claim 6, wherein one of the cam blocks is disposed adjacent each one of pairs of opposite sides of the pressure members.

8. An electrical socket according to claim 6, wherein the pressure members define slots which slidably receive fixed projections mounted with respect to the base, and the pivoting movement is defined by the pressure members pivoting on the fixed projections when the actuation forces are applied to the pressure members.

9. An electrical socket according to claim 8, wherein a pair of the fixed projections are disposed on opposite sides of each of the pressure members.

* * * * *